(12) United States Patent
Neyman

(10) Patent No.: US 10,714,925 B2
(45) Date of Patent: Jul. 14, 2020

(54) SELF-POWERED ELECTRONIC FUSE WITH STORAGE CAPACITOR THAT CHARGES WITH MINIMAL DISTURBANCE OF LOAD CURRENT THROUGH THE FUSE

(71) Applicant: Littelfuse, Inc., Chicago, IL (US)

(72) Inventor: Leonid A. Neyman, Sunnyvale, CA (US)

(73) Assignee: Littelfuse, Inc., Chicago, IL (US)

( * ) Notice: Subject to any disclaimer, the term of this patent is extended or adjusted under 35 U.S.C. 154(b) by 520 days.

(21) Appl. No.: 15/729,575

(22) Filed: Oct. 10, 2017

(65) Prior Publication Data
US 2019/0109454 A1 Apr. 11, 2019

(51) Int. Cl.
| | | |
|---|---|---|
| H02H 3/08 | (2006.01) | |
| H02H 3/38 | (2006.01) | |
| H02M 1/08 | (2006.01) | |
| H03K 17/082 | (2006.01) | |
| H02M 1/00 | (2006.01) | |
| H02M 1/32 | (2007.01) | |
| H02H 9/02 | (2006.01) | |

(52) U.S. Cl.
CPC ............ H02H 3/38 (2013.01); H02M 1/08 (2013.01); H03K 17/0822 (2013.01); *H02H 3/08* (2013.01); *H02H 9/025* (2013.01); *H02M 1/32* (2013.01); *H02M 2001/0009* (2013.01); *H03K 2217/0009* (2013.01); *H03K 2217/0081* (2013.01)

(58) Field of Classification Search
USPC ...................................... 361/93.1, 93.7–93.9
See application file for complete search history.

(56) References Cited

U.S. PATENT DOCUMENTS

| | | |
|---|---|---|
| 5,239,255 A | 8/1993 | Schanin et al. |
| 5,736,795 A | 4/1998 | Zuehlke et al. |
| 5,903,139 A | 5/1999 | Kompelien |

(Continued)

FOREIGN PATENT DOCUMENTS

| | | |
|---|---|---|
| JP | 2001345686 A | 12/2001 |
| JP | 2004535123 A | 11/2004 |

(Continued)

OTHER PUBLICATIONS

European Search Report and Written Opinion for the European Patent Application No. 18199341, dated Feb. 11, 2019, 8 pages.

*Primary Examiner* — Danny Nguyen

(57) ABSTRACT

A two-terminal electronic fuse device involves two switches, four diodes, switch control circuitry, and a storage capacitor, connected in a particular topology. When AC current flows through the fuse, a charging current charges the storage capacitor. Energy stored in the storage capacitor is then used to power the switch control circuitry. If the voltage on the storage capacitor drops, then the switches are opened briefly and at the correct time. Opening the switches allows the charging current to flow. By opening the switches and charging the storage capacitor only at times of low current flow through the fuse, the disturbance of load current flowing through the fuse is minimized. If an overload current condition is detected, then the fuse has tripped and first and second switches are opened. If the capacitor does not need charging and there is no overload condition, then the switches remain closed.

23 Claims, 7 Drawing Sheets

(56) References Cited

U.S. PATENT DOCUMENTS

| | | | |
|---|---|---|---|
| 6,288,458 B1 | 9/2001 | Berndt | |
| 7,546,473 B2 * | 6/2009 | Newman | H05B 39/044 |
| | | | 713/300 |
| 9,787,086 B2 * | 10/2017 | Dawley | H02H 9/02 |
| 2006/0255745 A1 | 11/2006 | DeJonge et al. | |
| 2010/0270982 A1 | 10/2010 | Hausman, Jr. et al. | |
| 2014/0375333 A1 | 12/2014 | Minagawa | |

FOREIGN PATENT DOCUMENTS

| | | |
|---|---|---|
| JP | 2008541381 A | 11/2008 |
| JP | 2009506481 A | 2/2009 |
| JP | 2011128353 A | 6/2011 |
| JP | 2014149388 A | 8/2014 |
| JP | 2014153520 A | 8/2014 |
| JP | 2019505156 A | 2/2019 |
| JP | 2019071608 A | 5/2019 |
| WO | 2000077915 | 12/2000 |
| WO | 2017127012 A1 | 7/2017 |

* cited by examiner

OPERATION OF THE CURRENT LIMITER CIRCUIT IN
CHARGING THE STORAGE CAPACITOR

OPERATION OF THE CURRENT LIMITER CIRCUIT IN CHARGING
THE STORAGE CAPACITOR FROM A FULLY UNCHARGED STATE

PERIODS OF TIME WHEN THE SWITCHES ARE OPEN
(TO RECHARGE THE STORAGE CAPACITOR)

SELF-POWERED eFUSE DEVICE
IN OPERATION

SELF-POWERED ELECTRONIC FUSE WITH STORAGE CAPACITOR THAT CHARGES WITH MINIMAL DISTURBANCE OF LOAD CURRENT THROUGH THE FUSE

TECHNICAL FIELD

The described embodiments relate to electronic fuses, and to related structures and methods.

BACKGROUND INFORMATION

A fuse is a protective device that is typically placed in a current path to electric circuitry to be protected. Before a condition dangerous to the equipment can occur (for example, a high current draw by the electric circuitry), the fuse blows or trips or otherwise opens. Typically the fuse melts in some fashion as a result of high current flow through the fuse. As a result the electrical connection between two terminals of the fuse is broken. Due to the opening of the fuse, current flow through the fuse to the electric circuitry is stopped. If the fuse does not blow or trip, then it serves as an in-tact low resistance part of the current path to the electric circuitry. There are various types of fuses. Fuses are designed to blow or trip under different conditions. If the fuse is of the type that is destroyed when it blows or trips, then the blown fuse must typically be removed from the circuit and replaced with a new fuse in order for the circuit to be operational again. Replacing fuses can be expensive. A fuse commonly referred to as an electronic fuse (or an "eFuse) is a type of fuse that is not destroyed when it opens (due to experiencing a predetermined potentially dangerous condition). Rather, when an electronic fuse opens it can be reset to be conductive again. An improved eFuse is desired.

SUMMARY

In a first novel aspect, an electronic fuse device that has two and only two externally accessible fuse device package terminals is self-powered. The self-powered electronic fuse device comprises a first fuse device package terminal, a second fuse device package terminal, a first switch, a second switch, a first diode, a second diode, a third diode, a fourth diode, a storage capacitor, and switch control circuitry. The first switch has a first terminal, a second terminal, and a third terminal. The first terminal of the first switch is coupled to the first fuse device package terminal. The first diode has anode and a cathode. The cathode of the first diode is coupled to the first terminal of the first switch. The anode of the first diode is coupled to the second terminal of the first switch. The second switch has a first terminal, a second terminal, and a third terminal. The first terminal of the second switch is coupled to the second fuse device package terminal. The second terminal of the second switch is coupled to the second terminal of the first switch at a second node. The second diode has an anode and a cathode. The cathode of the second diode is coupled to the first terminal of the second switch. The anode of the second diode is coupled to the second terminal of the second switch. The third diode has an anode and a cathode. The anode of the third diode is coupled to the cathode of the first diode. The fourth diode has an anode and a cathode. The anode of the fourth diode is coupled to the cathode of the second diode. The cathode of the fourth diode is coupled to the cathode of the third diode at a first node. The storage capacitor is coupled in a charging current path between the first node and the second node. The switch control circuitry, that is coupled to the third terminals of the first and second switches, is powered by energy stored in the storage capacitor. The housing houses the first switch, the second switch, the first diode, the second diode, the third diode, the fourth diode, the storage capacitor, and the switch control circuitry such that the first and second fuse device package terminals are the only electrical terminals of the self-powered electronic fuse device that are accessible from outside the self-powered electronic fuse device.

In one example, the first switch is a first NFET and the first diode is the body diode of the first NFET. Likewise, the second switch is a second NFET and the second diode is the body diode of the second NFET. When the storage capacitor is not being charged and there is no overload condition, the first and second switches are closed such that an AC current is conducted through the self-powered electronic fuse device. The AC current (which can be positive or negative) flows from the first fuse device package terminal, through the first switch, through the second switch, and out of the self-powered electronic fuse device via the second fuse device package terminal.

To charge the storage capacitor, the first and second switches are opened. If the first and second switches are opened, then the storage capacitor may be charged by current flow in a first current path in a first half of the period of the AC current. The first current path extends from the first fuse device package terminal, through the third diode to the first node, through the storage capacitor to the second node, and through the second diode to the second fuse device package terminal. Also, if the first and second switched are opened, then the storage capacitor may be charged by current flow in a second current path in a second half of the period of the AC current. The second current path extends from the second fuse device package terminal, through the fourth diode to the first node, through the storage capacitor to the second node, and through the first diode to the first fuse device package terminal. If the storage capacitor does not need charging and there is no overload condition during a half period, then the first and second switches remain closed throughout the half period and there is no storage capacitor charging during that half period.

In one example of the self-powered electronic fuse device, the charging current flowing from the first node to the second node flows through a current limiter circuit. The current limiter circuit comprises a depletion mode NFET. A resistor of the current limiter sets the maximum charging current that can flow through the current limiter. It therefore sets the maximum charging current with which the storage capacitor can be charged. A Zener diode of the current limiter sets the maximum voltage to which the storage capacitor can be charged.

In a second novel aspect, a method involves conducting an AC current through the self-powered electronic fuse device. In a steady state operating condition, the voltage on the storage capacitor is below a 12 volt voltage threshold but a current sense signal indicates that current flow through the self-powered fuse device is not below a 50 milliampere current threshold. The first and second switches of the self-powered electronic fuse device are on and conductive. The method involves waiting until the current sense signal indicates that the current flow is below the 50 milliampere current threshold. In response to the current sense signal indicating that the current flow is below the 50 milliampere current threshold, the first and second switches are turned off. Charging of the storage capacitor is then begun. As a charging current flows through the storage capacitor, the voltage on the storage capacitor increases up and rises above 12 volts. Charging of the storage capacitor continues with the first and second switches being off. Once the storage capacitor has been charged to 15 volts, the first and second switches are closed. Typically the absolute magnitude of instantaneous AC current flow through the self-powered electronic fuse device during the time period when the first and second switches are closed is greater that the absolute magnitude of instantaneous AC current flow through the self-powered electronic fuse device when the first and second switches are open and the storage capacitor is being charged. By only opening the first and second switches for this capacitor charging purpose during times when the AC load current is at a low level (for example, less than 50 milliamperes), disturbance of the AC load current flowing through the fuse as received by the load is minimized. Once the storage capacitor has been charged to 15 volts and the first and second switches have been closed, the first and second switches remain closed until either an overcurrent condition is detected or until the voltage on the storage capacitor drops to be below the 12 volt voltage threshold.

When the storage capacitor becomes discharged with its voltage less than the 12 volt voltage threshold, then the first and second switches become open for the capacitor charging purpose during times when the AC load current is at a low level (for example, less than 50 milliamperes). If current through the self-powered electronic fuse device is not enough to charge the capacitor, then both switches remain open and the load remains connected to the AC power source through the capacitor charging circuitry. Load current can flow through the capacitor recharging circuitry. If the storage capacitor ever becomes charged (for example, to 15 volts), then the self-powered electronic fuse device will close the switches. Otherwise the switches remain open.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings. In the description below, a switch that is "open" is said to be in the "off state", whereas a switch that is "closed" is said to be in the "on state". The phrases "turning on" a switch, or "switching on" a switch, or "closing" a switch mean putting the switch into the "on state". The phrases "turning off" a switch, or "switching off" a switch, or "opening" a switch mean putting the switch into the "off state".

Figure 1:
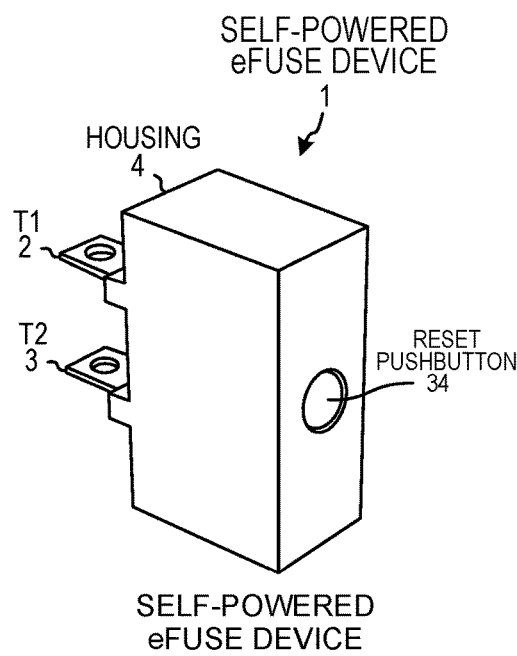
FIG. 1 is a perspective diagram of a self-powered electronic fuse device in accordance with one novel aspect.

FIG. 1 is a perspective diagram of a self-powered electronic fuse device 1 in accordance with one novel aspect. The "electronic fuse" device is also called an "eFuse". Self-powered electronic fuse device 1 comprises a first fuse device package terminal 2, a second fuse device package terminal 3, and an insulative housing 4. In one example, the housing 4 is one or more pieces of injection molded plastic that fit together so as to enclose and house electronic circuitry within the housing. A potting compound is provided within the housing 4 to occupy any volume that would otherwise be air space. The first and second fuse device package terminals 2 and 3 are pieces of stamped sheet metal that extend from the housing. They are the only electrical terminals of the self-powered fuse device 1 that are accessible from outside the self-powered fuse device. The shape and size of the self-powered electronic fuse device 1 is such that it can be pushed into a fuse receptacle. The self-powered electronic fuse device 1 can have any shape and size suitable for a fuse, including shapes and sizes of conventional standard fuses. The particular shape and size of the self-powered electronic fuse device 1 shown in FIG. 1 is just one possible shape and size.

Figure 2:
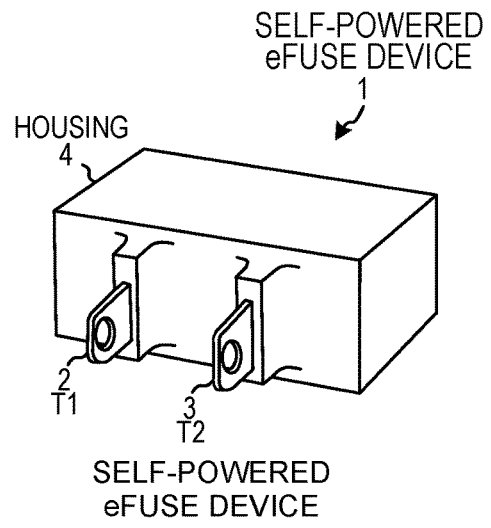
FIG. 2 is a perspective diagram that shows the bottom of the self-powered electronic fuse device of FIG. 1.

FIG. 2 is a perspective diagram that shows the bottom of the self-powered electronic fuse device 1.

Figure 3:
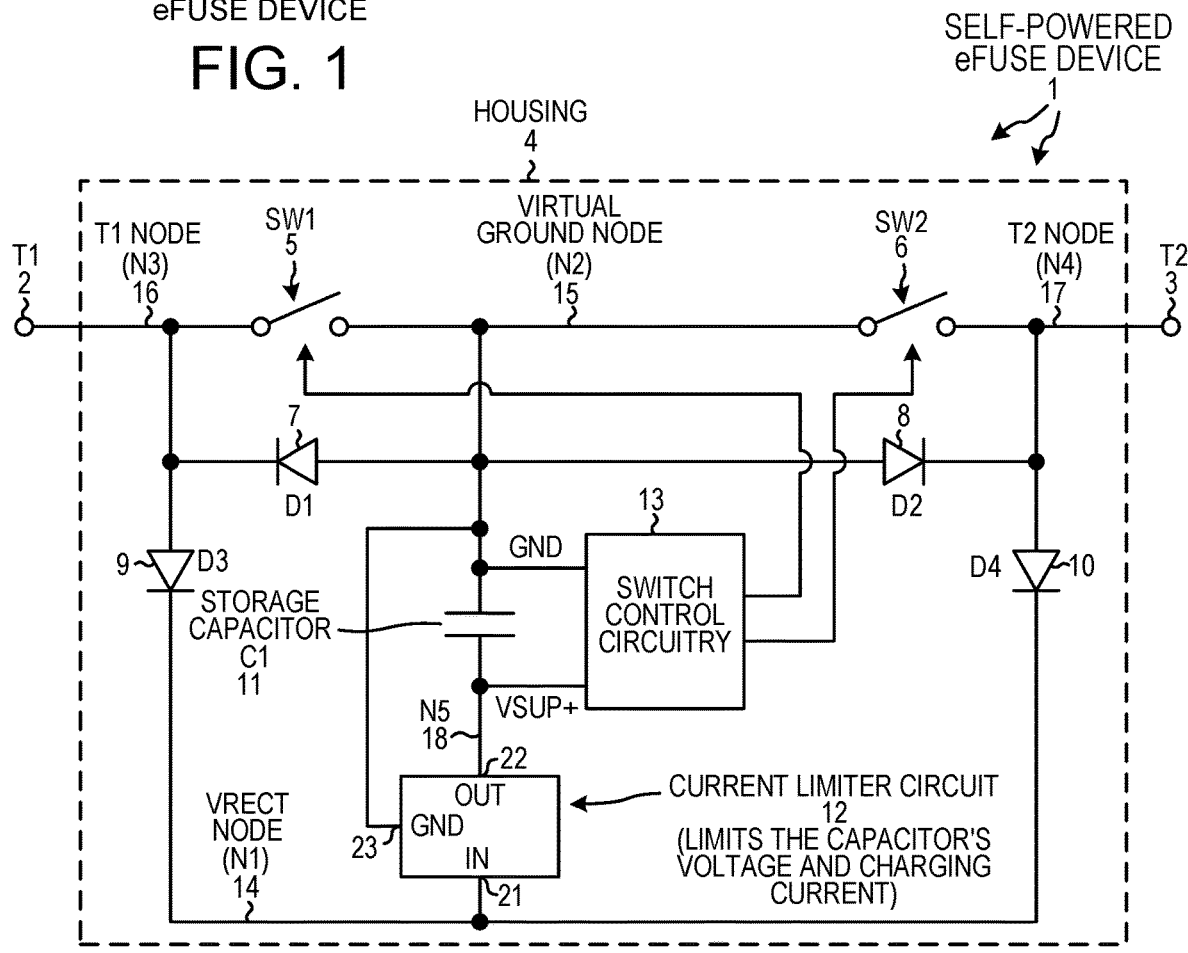
FIG. 3 is a circuit diagram of the self-powered electronic fuse device of FIG. 1.

FIG. 3 is a circuit diagram of the self-powered electronic fuse device 1. The self-powered electronic fuse device 1 comprises the first fuse device package terminal T1 2, a second fuse device package terminal T2 3, the housing 4, a first switch SW1 5, a second switch SW2 6, a first diode D1 7, a second diode D2 8, a third diode D3 9, a fourth diode D4 10, a storage capacitor C1 11, a current limiter circuit 12, and switch control circuitry 13. These terminals and electronic components may be mounted to a printed circuit board. The circuit includes a VRECT node N1 14, a virtual ground node N2 15, a first terminal node N3 16, a second terminal node N4 17, and a VSUP+ node N5 18. In a general sense, when there is not an overload current situation of a high current flow through the self-powered electronic fuse device 1, the self-powered electronic fuse device 1 is to function as a low resistance electrical conductor or short. Switches SW1 and SW2 are therefore to be on and conductive so that a low resistance (<100 milliohms) current path exists through the fuse between the first fuse device package terminal T1 and the second fuse device package terminal T2. If, however, there occurs an overload current condition, then the self-powered electronic fuse device is to "trip" such that there is no current flow through the self-powered electronic fuse device. Switches SW1 and SW2 are therefore to be off and non-conductive. In the example of FIG. 3, this overload current condition is a condition in which 40 amperes or more passes through the self-powered electronic fuse device. The switch control circuitry 13 is powered by energy stored in the storage capacitor 11.

Figure 4:
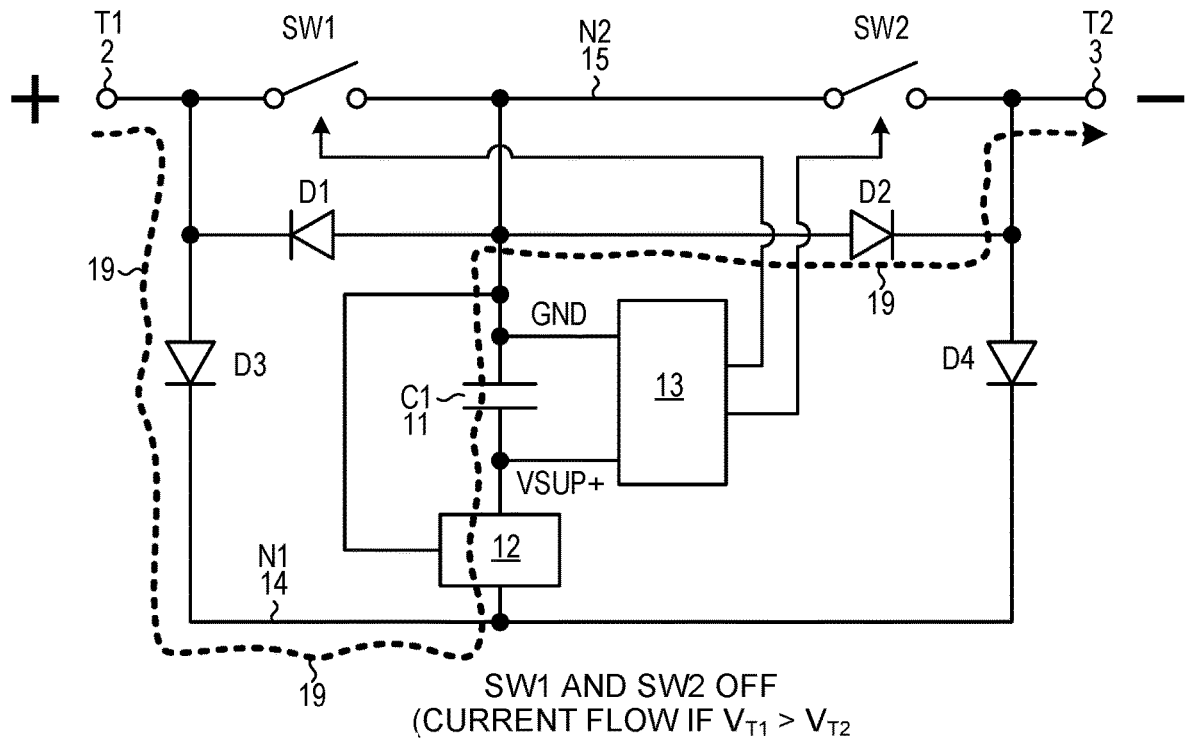
FIG. 4 is a diagram that illustrates how the storage capacitor of the self-powered electronic fuse device of FIG. 1 may be charged if the voltage $V_{T1}$ on the first fuse device package terminal T1 is higher than the voltage $V_{T2}$ on the second fuse device package terminal T2.

FIG. 4 illustrates how the storage capacitor 11 may be charged if the voltage $V_{T1}$ on the first fuse device package terminal T1 2 is higher than the voltage $V_{T2}$ on the second fuse device package terminal T2 3. To charge the storage capacitor 11, the first and second switches SW1 and SW2 are opened. Current flows in a first current path illustrated by the dashed line and arrow 19. The current limiter circuit 12 operates to allow current flow such that the voltage on the storage capacitor 11 can be charged up to a particular voltage threshold (19 volts, in this case), but the current limiter circuit 12 operates to limit or stop current flow such that the voltage on the storage capacitor 11 does not exceed the particular voltage threshold.

Figure 5:
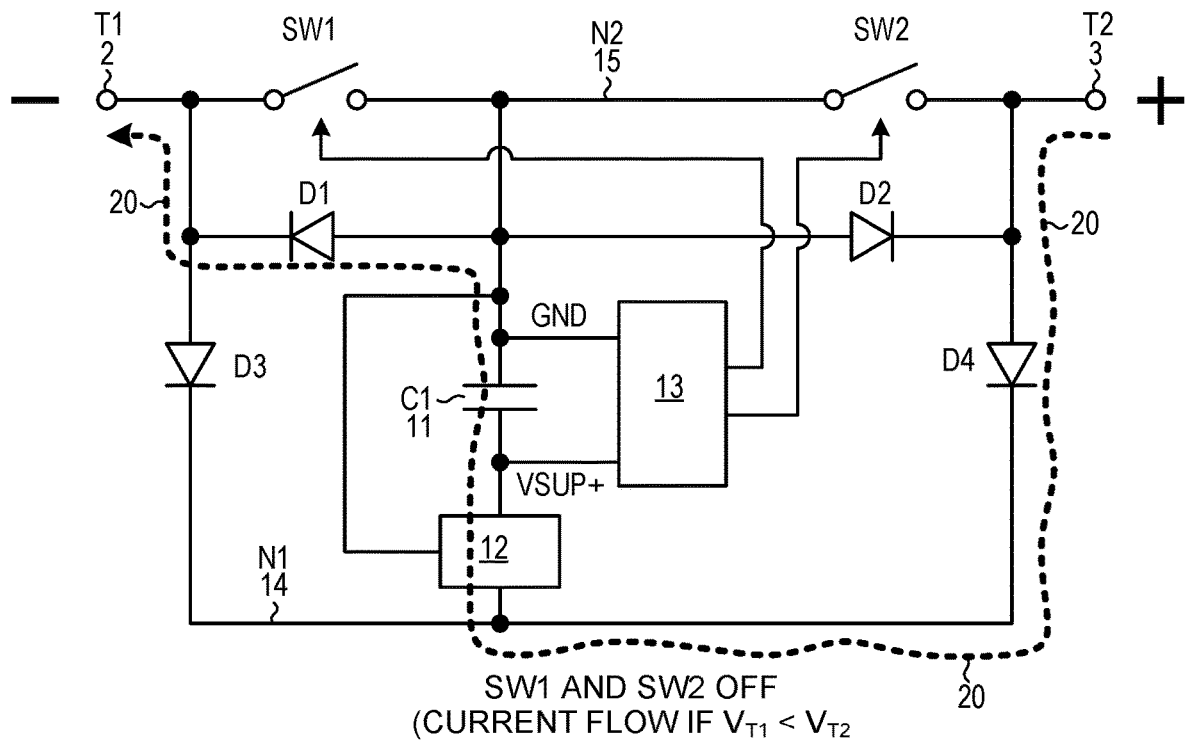
FIG. 5 is a diagram that illustrates how the storage capacitor of the self-powered electronic fuse device of FIG. 1 may be charged if the voltage $V_{T1}$ on the first fuse device package terminal T1 is lower than the voltage $V_{T2}$ on the second fuse device package terminal T2.

FIG. 5 illustrates how the storage capacitor 11 may be charged if the voltage $V_{T1}$ on the first fuse device package terminal T1 2 is lower than the voltage $V_{T2}$ on the second fuse device package terminal T2 3. Again, to charge the storage capacitor 11, the first and second switches SW1 and SW2 are opened. Current flows in a second current path illustrated by the dashed line and arrow 20. As in the case of the current flow of FIG. 4, the current limiter circuit 12 operates to allow current flow such that the voltage on the storage capacitor 11 can be charged up to the voltage threshold (19 volts), but the current limiter circuit 12 operates to limit or stop current flow such that the voltage on the storage capacitor 11 does not exceed the voltage threshold.

In a case in which the self-powered electronic fuse device is disposed in a sinusoidal AC current path, the current flow illustrated by arrow 20 of FIG. 5 is current that might flow in one half of the period of the AC current if switches SW1 and SW2 are off. The current flow illustrated by arrow 19 of FIG. 4 is current that might flow in the other half of the period of the AC current if switches SW1 and SW2 are off.

Figure 6:
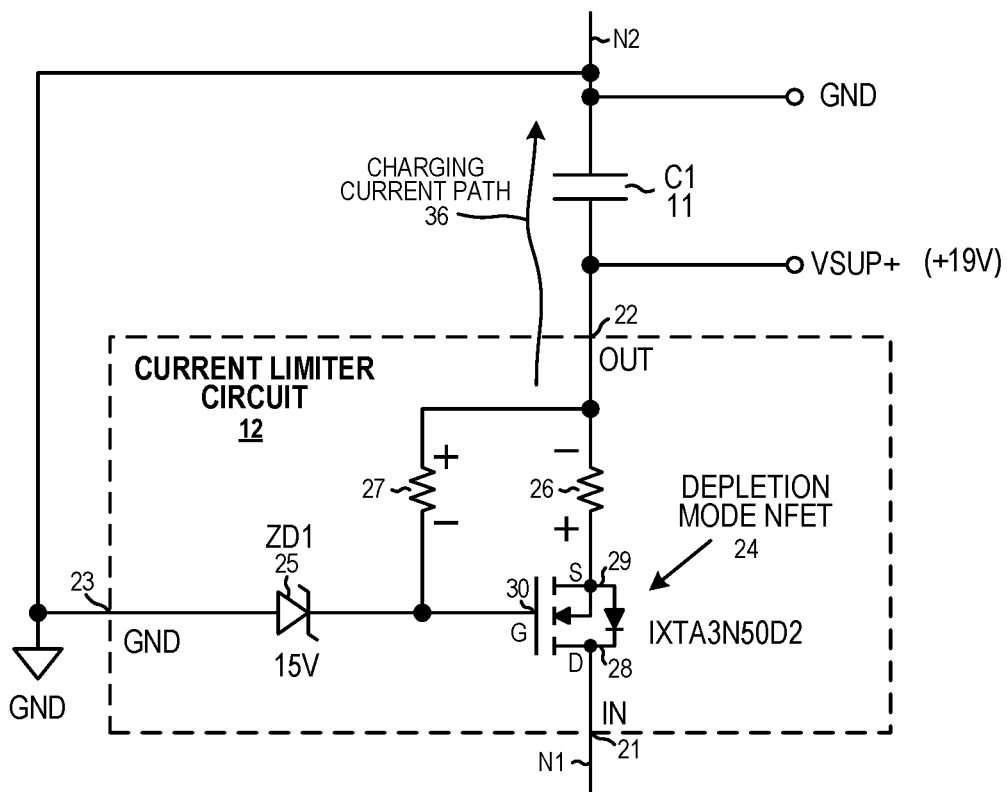
FIG. 6 is a diagram that illustrates operation of the current limiter circuit of the self-powered electronic fuse device of FIG. 1.

FIG. 6 is a diagram that illustrates one example of the current limiter circuit 12. In this example, the current limiter circuit 12 has three input/output connection nodes or points. These input/output connection nodes or points are denoted with reference numerals 21-23. These three points 21-23 are the same points 21-23 indicated on FIG. 3. The current limiter circuit 12 comprises a depletion mode N-channel Field Effect Transistor (NFET) 24, a Zener diode 25, and two resistors 26 and 27. The ground node GND is virtual ground node N2 15 of FIG. 3. Node N1 is the VRECT node N1 14 of FIG. 3.

Consider a situation in which the storage capacitor C1 11 is discharged such that it has a voltage below 12 volts. If the voltage on the N1 node is higher than the voltage on the N2 node, then current can flow into the current limiter circuit 12 via the IN point 21. The depletion mode NFET 24 conducts. Current flows from the drain 28, through the depletion mode NFET 24, and out of the depletion mode NFET 24 via source 29. Current flows from the OUT point 22, and through the storage capacitor 11, and to the node N2. Arrow 36 illustrates the path of this charging current. The magnitude of the charging current is limited by resistor 26. The depletion mode NFET 24 has a threshold voltage of about minus 4 volts. If the voltage on the gate 30 of NFET 24 drops so that it is 4 volts or more lower than the voltage on the source of NFET 24, then the NFET 24 turns off. Due to the connection of the resistors 26 and 27, if current flow through NFET 24 is high enough that the voltage drop across resistor 26 approaches four volts, then the NFET 24 begins to turn off. The reduction in the amount of current flow reduces the voltage drop across the resistor 26, and the voltage on the gate 30 of the depletion mode NFET is not as negative with respect to the voltage on the source. The result is that the depletion mode NFET 24 limits current flow to a peak charging current that is set by resistor 26. Zener diode 25 sets the maximum voltage to which the storage capacitor 11 can be charged. Due to the charging current, the voltage on the storage capacitor 11 increases as the storage capacitor 11 is charged. The voltage on the storage capacitor 11 cannot, however, exceed about 19 volts because Zener diode 25 prevents the voltage on the gate 30 of the depletion mode transistor 24 from exceeding 15 volts. When the voltage across the storage capacitor 11 approaches 19 volts, the voltage on the source 29 of the depletion mode NFET 24 also approaches 19 volts. The $V_{GS}$ approaches the minus four volt $V_{GS}$ threshold voltage. The depletion mode NFET 24 therefore starts to turn off. The depletion mode NFET 24 cannot be on and conductive for capacitor voltages of 19 volts or more.

Figure 7:
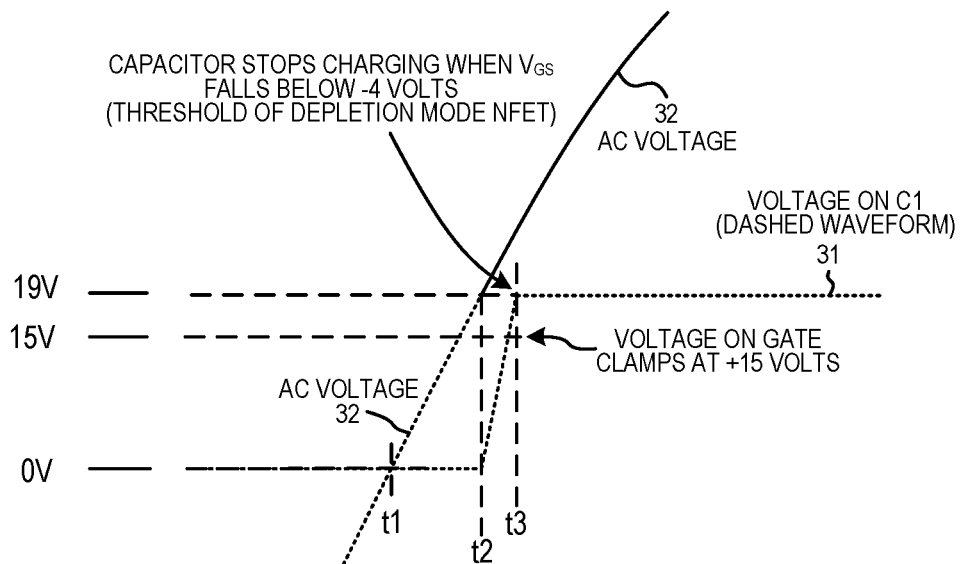
FIG. 7 is a diagram that illustrates a charging of the storage capacitor of the self-powered electronic fuse device of FIG. 1.

FIG. 7 is a diagram that illustrates a charging of the storage capacitor 11 from a fully discharged state. The dashed waveform 31 represents the voltage on the storage capacitor. The thinner solid waveform 32 represents a sinusoidal AC voltage due to a 50 Hertz, 240 volt RMS, AC power source. The self-powered electronic fuse device 1 is initially not in the current path of the sinusoidal AC power source. Time t1 represents the zero crossing time of the sinusoidal AC voltage. At this time, in the illustrated example, the self-powered electronic fuse device 1 is still not in the AC current path. The voltage of the sinusoidal AC voltage increases from zero volts. In the particular illustrated example, the self-powered electronic fuse device 1 is first coupled into the AC current path at time t2. The AC voltage waveform 32 is therefore shown in dashed form before time t2 to illustrate that the AC voltage during this time is not present across the fuse. Starting at time t2, the voltage of the sinusoidal AC voltage is present across the self-powered electronic fuse device 1 between fuse device package terminals T1 and T2. The storage capacitor 11 therefore begins charging from zero volts. The charging current is constant and fixed by the resistor 26 of the current limiter circuit 12. The voltage on the storage capacitor 11 as represented by waveform 31 therefore increases fairly linearly. The voltage on the gate of the depletion mode NFET 24 clamps at 15 volts, and then capacitor charging stops at time t3 when the voltage on the storage capacitor 11 reaches about +19 volts at time t3. If the storage capacitor 11 is charging at its maximum rate as set by resistor 26 of the current limiter circuit 12, then it takes about 0.6 milliseconds for the storage capacitor 11 to charge starting from an initially fully discharged state of zero volts on the capacitor until the capacitor is charged to +19 volts. Ten milliseconds is the half period of the 50 Hertz AC voltage sinusoidal wave. The storage capacitor 11 can therefore fully charge in a charging time period of only six percent of the half period of the 50 Hertz AC voltage sinusoidal wave. The time period between time t2 and t3 is this short charging time period.

In the illustrated example of FIG. 7, the self-powered electronic fuse device 1 is shown being first coupled into the AC current path at time t2 when the voltage of the AC voltage wave is on the increase. The voltage on the storage capacitor 11 therefore increases and the AC voltage increases as well. This need not be the case. The self-powered electronic fuse device 1 in another example is coupled into the AC current path at a time when the voltage of the AC voltage wave is on the decrease. In such a case, the voltage on the storage capacitor 11 will increase when the voltage of the AC wave is on the decrease. Regardless of when the charging of the storage capacitor starts, the maximum charging current is limited by and is set by resistor 26 of the current limiter circuit 12.

When the storage capacitor 11 is charged for the very first time starting from its fully discharged state, it is charged up to 19 volts as illustrated in FIG. 7. Thereafter energy stored in the storage capacitor 11 is used to power the circuitry of the self-powered electronic fuse device. The voltage on the storage capacitor 11 therefore decreases and eventually needs recharging. In a recharging operation, however, the storage capacitor 11 is not recharged all the way up to its 19 volt maximum. Rather, as is explained in further detail below, a comparator circuit monitors the voltage on the storage capacitor 11. When the comparator circuit determines that the voltage on the storage capacitor 11 has exceeded a 15 volt voltage threshold, then the comparator circuit causes further charging of the storage capacitor 11 to stop. Further charging is stopped by closing switches SW1 and SW2. Accordingly, on recharging operations following the first initial capacitor charging, the storage capacitor 11 is charged up to the 15 volt voltage threshold.

Figure 8:
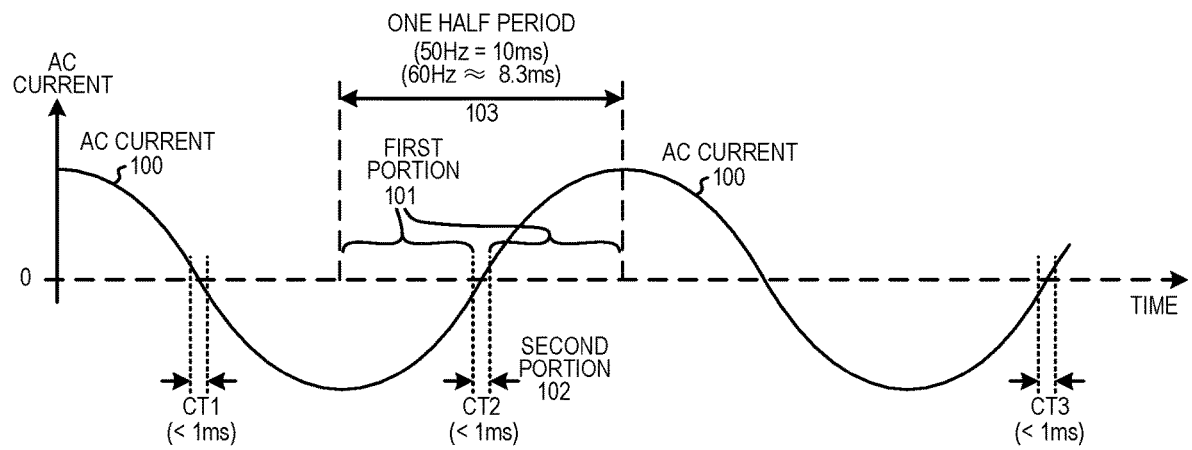
FIG. 8 is a waveform diagram that illustrates time periods during which the first and second switches are closed, and time periods during which the first and second switches are opened so that the storage capacitor can be recharged.

FIG. 8 is a simplified waveform diagram that illustrates several "switch open time periods" CT1, CT2 and CT3 during which the first and second switches are open so that the storage capacitor 11 can be recharged. These time periods are shown with respect to a sinusoidal AC current 100 that is flowing through the self-powered electronic fuse device 1. In the particular example illustrated, the first and second switch open time periods CT1 and CT2 occur during consecutive half periods of the AC current. There is no switch open time period during the next half period. The third switch open time period CT3 occurs during the next half period. Accordingly there may be a switch open time period during a particular half period of the AC current, or there may be no switch open time period during that particular half period of the AC current. Whether there is a switch open time period during a particular half period of the AC current depends on whether the storage capacitor needs to be recharged. In the illustrated example, and in all examples, the duration of each "switch open time period" is always less than one millisecond. The half period of a 50 Hertz sinusoidal AC current is 10 milliseconds. Reference numeral 103 identifies one such half period. The half period of a 60 Hertz sinusoidal AC current is about 8.3 milliseconds. For 50 Hz and 60 Hz AC currents, the duration of each switch open time period is therefore always less than fifteen percent (15%) of the duration of the half period of the sinusoidal AC current flowing through the self-powered electronic fuse device. For example, during a first portion 101 of the half period 103 the switches SW1 and SW2 are closed, and the storage capacitor is not recharging. During the second portion 102 (CT2) of the half period 103, the switches SW1 and SW2 are open. It is during this second portion 102 (CT2) that the storage capacitor is charged. Within this second portion 102, the storage capacitor may be charged for an amount of time, and then charging stops during a short time around the zero crossing time, and then charging of the capacitor resumes, but throughout the entire second portion of time 102 the first and second switches SW1 and SW2 are open.

Figure 9:
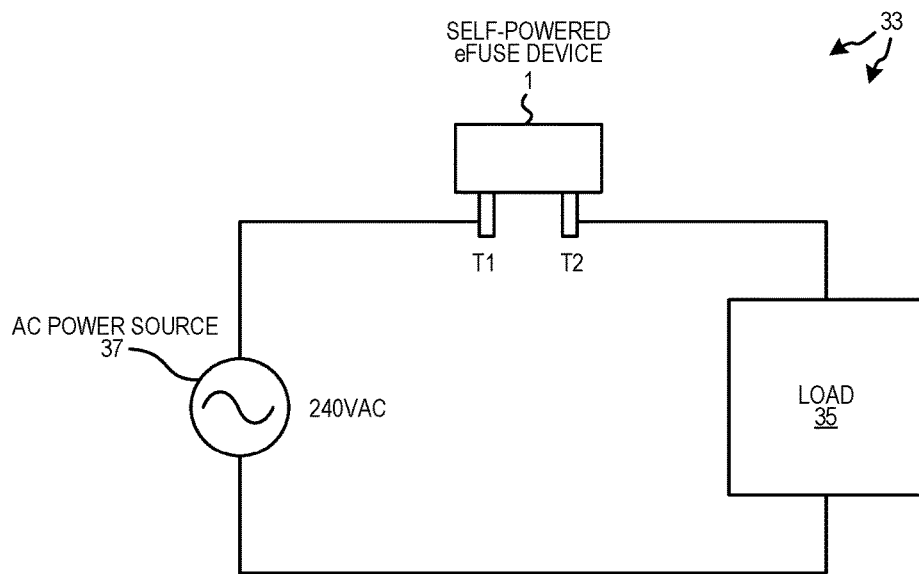
FIG. 9 is a diagram that illustrates the self-powered electronic fuse device of FIG. 1 in operation in a system involving an AC power source.

FIG. 9 is a diagram that illustrates the self-powered electronic fuse 1 in operation in a system 33. System 33 involves a 240 volt AC power source 37, a load 35, and the self-powered electronic fuse 1. If current flow through the self-powered electronic fuse 1 exceeds the 40 ampere overload current, then the self-powered electronic fuse 1 trips. The switches SW1 and SW2 within it open, and no current can flow through the self-powered electronic fuse 1. The self-powered electronic fuse 1 stays in this open (tripped) condition until either: 1) a reset pushbutton 34 is pressed, or 2) the self-powered electronic fuse 1 is somehow disconnected from AC power. The self-powered electronic fuse 1 can be disconnected from AC power by removing the fuse from its fuse receptacle. The self-powered electronic fuse 1 can also be disconnected from AC power by turning off the AC power source 37.

Figure 10:
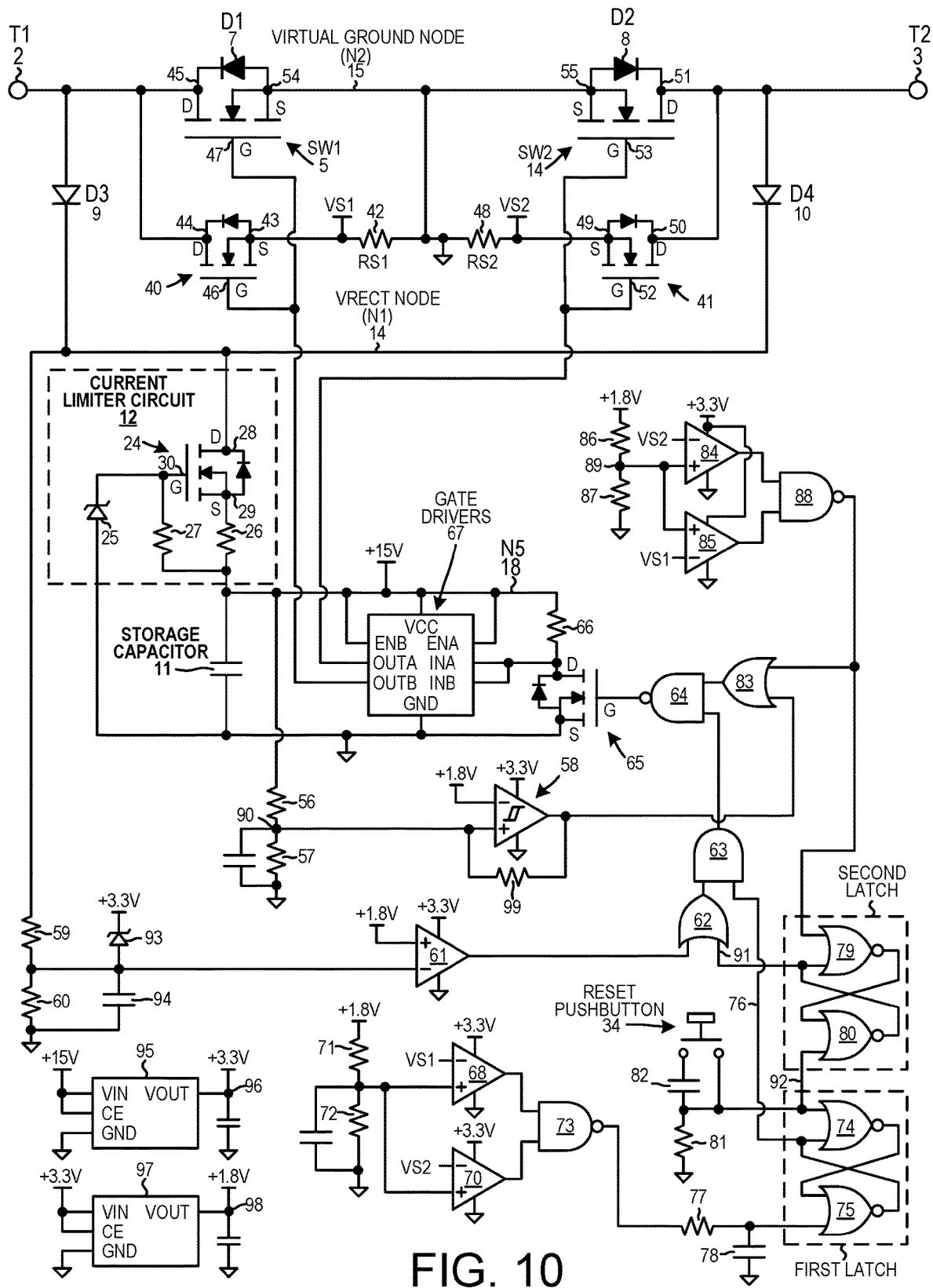
FIG. 10 is a more detailed circuit diagram of the self-powered electronic fuse device of FIG. 1.

FIG. 10 is a more detailed circuit diagram of self-powered electronic fuse device 1. The first switch SW1 5 is a first power NFET and the second switch SW2 6 is a second power NFET. The first diode D1 7 is the body diode of the first power NFET 5. The first power NFET and the first diode are parts of the same semiconductor die. The second diode D2 8 is the body diode of the second power NFET 6. In addition to these transistors, there is also a first current mirror NFET 40 and a second current mirror NFET 41. A first current sense resistor 42 is coupled between the source 43 of the first current mirror NFET 40 and the virtual ground node N2 15. The drain 44 of the first current mirror NFET 40 is coupled to the drain 45 of the first power NFET 5. The voltage VS1 is the voltage drop across the first sense resistor 42. The gate 46 of the first current mirror NFET 40 is coupled to the gate 47 of the first power NFET 5. Current flow through the first current mirror NFET 40 is ¹⁄₁₀₀ of the current flow through the first power NFET 5. A second current sense resistor 48 is coupled between the source 49 of the second current mirror NFET 41 and the virtual ground node N2 15. The drain 50 of the second current mirror NFET 41 is coupled to the drain 51 of the second power NFET 6. The voltage VS2 is the voltage drop across the second sense resistor 48. The gate 52 of the second current mirror NFET 41 is coupled to the gate 53 of the second power NFET 6. Current flow through the second current mirror NFET 41 is ¹⁄₁₀₀ of the current flow through the second power NFET 14. The source 54 of the first power NFET 5 is coupled to the source 55 of the second power NFET 6 at the virtual ground node N2 15. The voltage drop VS1 is indicative of current flow through the first switch SW1. The voltage drop VS2 is indicative of current flow through the second switch SW2. The first power NFET, and first current mirror NFET, and the first diode are parts of the same first semiconductor die. The second power NFET, and second current mirror NFET, and the second diode are parts of the same second semiconductor die. The current sense circuity of the current mirror NFETs 40 and 41 and the current sense resistors 42 and 48 is considered part of the switch control circuitry 13 of FIG. 3. Importantly, there is no current sense circuitry or sense resistor in the main current path from the first fuse device package terminal T1, through the first switch SW1, through the second switch SW2, and to the second fuse device package terminal T2.

When the self-powered electronic fuse device 1 is initially connected to the AC power source 37 with the load 35 in series (see FIG. 9), both the first and second switches SW1 and SW2 are in an off state. There is zero volts on the storage capacitor 11. The storage capacitor 11 starts charging through either diode D3 or D4, the depletion mode NFET 24, resistor 26, and the body diode of one of the power NFETs 5 and 6. A voltage threshold is set by a resistor voltage divider comprising resistors 56 and 57. This voltage threshold is 15 volts. In an ordinary recharging operation, as soon as the voltage on the storage capacitor 11 exceeds this 15 volt voltage threshold, the output of comparator 58 would transition from low to high, thereby allowing the fuse circuitry to turn on the switches SW1 and SW2. Turning on the switches SW1 and SW2, as explained above, would terminate the recharging cycle so that the voltage on the storage capacitor 11 would be left at 15 volts. The turning on of the switches SW1 and SW2 would also, however, couple the load to the AC power source 37. In order to minimize initial surge current flowing through the self-powered electronic fuse device 1 when the switches SW1 and SW2 are first turned on, initial turn on of the SW1 and SW2 switches is delayed until the AC input voltage falls below a voltage threshold. This voltage threshold is 20 volts and is set by a resistor voltage divider involving resistors 59 and 60. The AC input voltage, in rectified form, is the voltage on the VRECT node 14 as compared to the voltage on the virtual ground node N2 15. Because the first turn on of the switches SW1 and SW2 is delayed, the voltage on the storage capacitor 11 during this first charging operation exceeds 15 volts and reaches its maximum of 19 volts. After this delay, when the voltage threshold drops to be below 20 volts, the output of comparator 61 transitions from low to high. This causes the output of OR gate 62 to transition from low to high. At this point, both inputs of two-input AND gate 63 are digital logic high voltages, so AND gate 63 outputs a digital logic high value onto the lower input lead of NAND gate 64. A digital logic high is also present on the other input lead of NAND gate 64. NAND gate 64 therefore outputs a digital logic low signal onto the gate of NFET 65. The digital logic low signal on the gate of NFET 65 causes NFET 65 to be off. The voltage on the drain of NFET 65 is pulled up to a high logic level by pullup resistor 66. The drain is coupled to the INA and INB terminals of gate driver integrated circuit 67. Gate driver integrated circuit 67 includes two non-inverting low side gate drivers. The INA terminal is coupled to the input of the first gate driver and the OUTA terminal is coupled to the output of the first gate driver. The INB terminal is coupled to the input of the second gate driver and the OUTB terminal is coupled to the output of the second gate driver. Both gate drivers are enabled by virtue of the enable input terminals ENA and ENB both being supplied by the voltage on node N5, which at this point +19 volts. As a result, the gate drivers drive +19 volt voltages onto the gates of the first and second switches SW1 and SW2. This turns on the first and second switches SW1 and SW2.

As explained above in connection with FIG. 6, transistor 24 is a depletion mode NFET. It is used to charge the storage capacitor 11 with a steady current without regard to the momentary value of the AC input voltage when the AC input voltage is higher than the storage capacitor's voltage. The magnitude of the charging current is set by the voltage drop across resistor 26. If the voltage on the storage capacitor 11 exceeds the 15 volt voltage threshold of the Zener diode 25, then the voltage on the gate 30 of the depletion mode NFET 24 becomes clamped at this +15 volt Zener diode voltage. The voltage on the source 29 of the depletion mode NFET 24, however, continues to rise. When the voltage on the source 29 exceeds the voltage on the gate 30 by about minus four volts (i.e., becomes more negative than the minus four volt $V_{GS}$ threshold of the depletion mode NFET), the depletion mode NFET 24 turns off. This prevents the storage capacitor 11 from overcharging and increasing power consumption. The result is that the voltage on the storage capacitor 11 at the end of the first charging operation is left at +19 volts.

If the load current exceeds the 40 ampere overload current, then this is to be detected as an overload current condition. The voltage drop across one of the current sense resistors 42 and 48 exceeds the reference voltage on the corresponding comparator 68 and 70 voltage threshold. This reference voltage is set by a resistor voltage divider involving resistors 71 and 72. One of the two comparators 68 and 70 trips and outputs a digital logic low signal. NAND gate 73 therefore outputs a digital logic high signal. This causes a first RS latch to be set. The first RS latch is formed by NOR gates 74 and 75. The setting of this RS latch causes the latch to output a digital logic low signal onto node and conductor 76. Due to the digital logic low signal on conductor 76, the AND gate 63 outputs a digital logic low signal. The presence of this digital logic low logic signal on an input of NAND gate 64 causes the NAND gate 64 to output a digital logic high signal. This turns on the NFET 65, and puts a digital logic low level signal onto the INA and INB inputs of the gate drivers 67. The gate drivers 67 therefore drive the gate voltages on the first and second switches to zero volts, and the first and second switches SW1 and SW2 are turned off. The turning off of the first and second switches SW1 and SW2 is the desired action under an overload current condition.

The RC network comprising resistor 77 and capacitor 78 prevents false overload current fuse tripping (turning off of the switches SW1 and SW2 due to a detected overload current condition) in the case of high frequency AC noise. The time constant set by resistor 81 and capacitor 82 determines the minimum time between the initial power up of the fuse circuitry and the moment when an overload condition can first be detected. After an overload condition, the self-powered electronic fuse device will remain in the off state (switches SW1 and SW2 off) as long as either: 1) AC power to the fuse is not removed such that storage capacitor 11 discharges completely, or 2) pushbutton 34 is not pressed. Pressing pushbutton 34 causes the first RS latch to be reset.

In addition to the first RS latch involving NOR gates 74 and 75, there is also a second RS latch. This second RS latch involves NOR gates 79 and 80. This second RS latch is used to prevent switches SW1 and SW2 from turning on after initial power up, if the AC voltage is higher than 20 volts if the storage capacitor is completely discharged. Preventing the switches SW1 and SW2 from turning on when the AC voltage is higher than 20 volts at this initial power time prevents surge current due to the load being connected at a high voltage condition. Upon power up of the fuse circuitry, the second RS latch is reset. The reset state of the second RS latch is the state in which NOR gate 80 outputs a digital logic low signal.

When both the first and second switches SW1 and SW2 are on and conducting, the voltage drop $V_{FUSE}$ across the fuse between the T1 and T2 terminals is determined by the load current and the $R_{DC(ON)}$ resistances of the SW1 and SW2 switches. The voltage drop $V_{FUSE}$ across the fuse is therefore approximately equal to $2R_{DC(ON)} \times I_{LOAD}$. Because this voltage in normal conditions does not exceed the minimum voltage on the storage capacitor as required for fuse operation, the storage capacitor discharges during times when the switches SW1 and SW2 are on. The storage capacitor therefore discharges and requires periodic recharging.

The recharging process starts when both of the following conditions are true: 1) the voltage on the storage capacitor 11 is less than 12 volts, and 2) the load current is less than the 50 milliampere current threshold. Comparator 58 detects that the voltage on the storage capacitor 11 has dropped below 12 volts. The resistor 99 provides hysteresis. If the voltage on the storage capacitor drops below 12 volts, then the comparator 58 begins outputting a digital logic low signal. If the voltage on the storage capacitor then increases, the comparator 58 will not begin outputting a digital logic high signal until the voltage on the storage capacitor rises above 15 volts. When the circuitry of the fuse consumes energy out of the storage capacitor and the voltage on the storage capacitor drops below 12 volts, the comparator 58 begins outputting a digital logic low signal. This digital logic low signal is supplied onto one input lead of OR gate 83. The digital logic low signal cannot pass through the OR gate 83, however, if the digital signal on the other input lead of OR gate 83 is a digital logic high value. The first and second switches SW1 and SW2 are to be opened for a recharging operation only when the load current flowing through the fuse is a small current close to zero. If the load current flow through the fuse is large, then the circuit is to wait to open the first and second switches SW1 and SW2 for a recharging operation. Accordingly, if the comparators 84 and 85 are detecting a load current that is not below a 50 milliampere current threshold established by resistor divider of resistors 86 and 87, then NAND gate 88 outputs a digital logic high. This effectively blocks the digital logic low signal on the other input lead of the OR gate 83 from passing through the OR gate 83. As the magnitude of the AC current passing through the fuse decreases, current flow through the fuse eventually drops below the 50 milliampere current threshold established by the resistor divider of resistors 86 and 87. At this point the voltage drops across both sense resistors 42 and 48 are below the voltage on the center node 89 of the resistor voltage divider. Both comparators 84 and 85 output digital logic high signals. NAND gate 88 therefore outputs a digital logic low signal. Because the signals on both of the two input leads of OR gate 83 are now at digital logic low levels, OR gate 83 outputs a digital logic low signal. This causes NAND gate 64 to output a digital logic high, and causes NFET 65 to turn on, and causes digital logic low signals to be put onto the INA and INB inputs of the gate drivers 67, and causes the gate drivers to drive the voltages on the gates of the SW1 and SW2 switches to ground. This turns off the switches SW1 and SW2 in preparation for a recharging of the storage capacitor 11. Importantly, the switches SW1 and SW2 are only turned off for this capacitor recharging purpose when the load current flowing through the fuse is at a low level (less than 50 milliamperes). This minimizes disturbance of the load current flowing through the fuse as received by the load. With the switches SW1 and SW2 open, the storage capacitor recharging process described above can proceed.

At the end of the recharging process, the first and second switches SW1 and SW2 can be turned on again when the voltage on the storage capacitor 11 becomes higher than the voltage on the centertap 90 of the resistor voltage divider involving resistors 56 and 57. Ignoring the effect of the signal on input lead 91 of OR gate 62, the switches SW1 and SW2 can only be turned on again if the AC voltage is lower than the 20 volt voltage threshold set by the resistor voltage divider of resistors 59 and 60. In the case of the load being inductive, there may be a substantial phase shift between the load current flow through the fuse and the AC voltage across the fuse. This phase shift may be so large that it does not allow the fuse to turn on (even though the storage capacitor is now fully charged) if the AC voltage becomes higher than the voltage threshold set by the resistor divider of resistors 59 and 60. To prevent this, the output signal as output from comparator 61 is used (to determine when to turn on SW1 and SW2) only when the load is being turned on the first time. In a subsequent turn on of the switches SW1 and SW2 after a recharging operation, when a load current exceeding 50 milliamperes has been detected, the signal from NAND gate 88 transitions high and sets the second RS latch of NOR gates 79 and 80. The setting of the second RS latch puts a digital logic high signal onto the input lead 91 of OR gate 62. This effectively blocks the digital logic low signal being output by comparator 61 from passing through OR gate 62 and holding the switches SW1 and SW2 in the off state. Because the turn on of the switches SW1 and SW2 cannot be blocked by the output signal from comparator 61, the switches can be turned on depending on the value of the signal output by comparator 58. If the storage capacitor has been charged to have a voltage greater than 15 volts, then comparator 58 outputs a digital logic high signal, and this high signal passes through OR gate 83 to that a digital logic high signal is present on the upper input of NAND gate 64. The signal on the lower input of NAND gate 64 is a digital logic high because AND gate 63 is outputting a digital logic high signal. NAND gate 64 therefore outputs a digital logic low signal when the capacitor has become charged to 15 volts. As a result, NFET 65 is turned off, and the voltage on the INA and INB leads of the gate drivers are high voltages, and the gate drivers turn on the switches SW1 and SW2. Accordingly, the recharging process ends when comparator 58 detects that the voltage on the storage capacitor 11 is 15 volts or higher.

The initial state of the second RS latch of NOR gates 79 and 80 is determined by the RC network involving resistor 81 and capacitor 82. Upon power up, capacitor 82 has not yet charged, so a digital logic high signal is initially present on node and conductor 92. This resets the second latch such that OR gate 80 outputs a digital logic low level signal. In this reset state, the second latch does not block the signal as output by comparator 61. But once the second latch has been set (after the delay due to the RC time constant of resistor 81 and capacitor 82 and after a load current exceeding 50 milliamperes has been detected), thereafter the second latch does block the signal as output by comparator 61.

Zener diode 93 and capacitor 94 are provided to prevent damage to comparator 61 in the event of AC voltage spikes. Low-dropout (LDO) voltage regulator 95 is powered from the supply voltage on the storage capacitor 11 and on node N5 18. The LDO voltage regulator 95 outputs a 3.3 volt supply voltage onto the +3.3 volt node 96. This +3.3 volt supply voltage powers all the comparators and all the digital logic circuitry of the fuse. The circuitry of the self-powered electronic fuse device is in the idle state most of the time. Expected average current consumption from the +3.3 supply voltage is less than 0.5 milliamperes. LDO voltage regulator 97 is powered from the +3.3 supply voltage, and it outputs a +1.8 volt supply voltage onto the +1.8 volt node 98. Average current consumption from the +1.8 volt supply voltage is below 50 microamperes. In one example, the gate driver integrated circuit 67 is a low side gate driver integrated circuit such as IXDN602 or IXDN604 available from IXYS Corporation, 1590 Buckeye Drive, Milpitas, Calif. NFET 65 is provided to shift the gate driver's input voltage to the level of the storage capacitor, thereby minimizing the current consumption of the gate drivers in a steady state to about ten microamperes. Without this level shifting, current consumption of the gate driver integrated circuit 67 in steady state would be about three milliamperes. If no load is connected, then the fuse consumes no power. After the storage capacitor 11 has fully discharged, the fuse is again in its initial state. The fuse then waits for a load to be connected. After connection of a load, current flows through the fuse, and the fuse initializes and closes switches SW1 and SW2, thereby connecting the load 35 to the AC power source 34. This closing of the switches SW1 and SW2 occurs with a maximum delay of a one half of the period of the AC power signal (from the time the load is first connected until the switches are closed).

Figure 11:
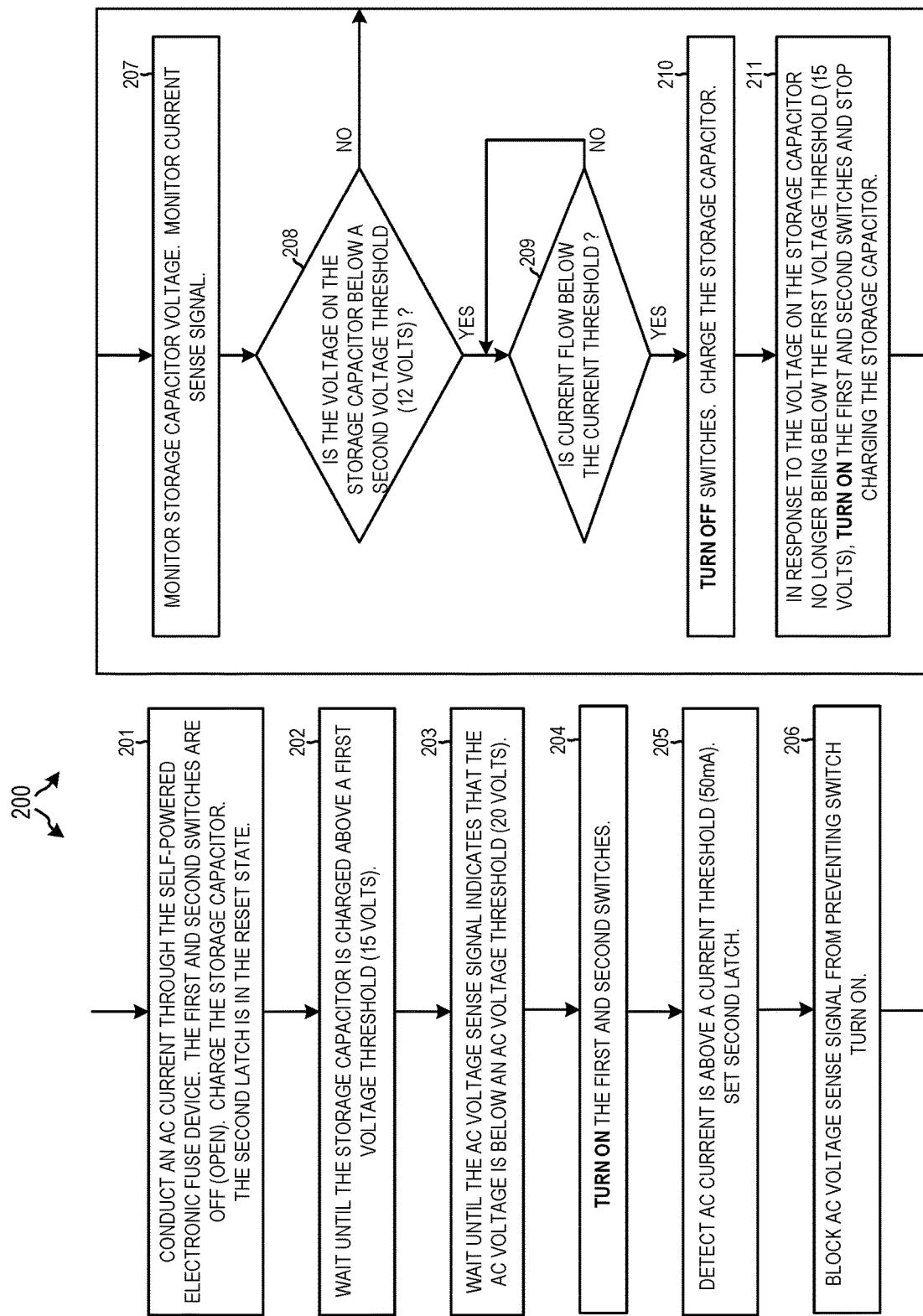
FIG. 11 is a flowchart of a method in accordance with one novel aspect.

FIG. 11 is a flowchart of a method 200 involving the self-powered fuse device 1 when there is no overload condition. Initially, the storage capacitor is in a fully discharged state. An AC current is then conducted (step 201) through the self-powered electronic fuse device of FIG. 10 when the first and second switches SW1 and SW2 are off (open). This causes the storage capacitor to be charged. The fuse circuitry waits (step 202) until the voltage on the storage capacitor is above a first voltage threshold (15 volts). The fuse circuitry waits (step 203) until the AC voltage across the fuse is below an AC voltage threshold (20 volts). The first and second switches are then turned on (step 204). At this point, the storage capacitor has been charged up to at least 15 volts for the first time. The fuse circuitry detects (step 205) that the AC current flowing through the fuse is above a current threshold (50 milliamperes) and in response sets the second latch. This setting of the second latch blocks (step 206) the AC voltage sense signal from preventing switch turn on. The fuse circuitry monitors (step 207) the voltage on the storage capacitor and the current sense signal. If the voltage on the storage capacitor is determined (step 208) to be below a second voltage threshold (12 volts), and if the AC current is determined (step 209) to be below the current threshold (50 milliamperes), then the switches are turned off (step 210). The turning off of the switches allows the storage capacitor to start recharging. The voltage on the storage capacitor increases. When the voltage on the storage capacitor is no longer below the first voltage threshold (15 volts), then the switches are turned on (step 211). The turning on of the switches stops the recharging of the storage capacitor.

The steps 207 through 211 on the right side of the flowchart represent steps that occur during steady state operation of the self-powered fuse device. When the voltage on the storage capacitor is detected to have fallen below the second voltage threshold (12 volts), then the switches are turned off (opened) when the AC current drops below the current threshold (50 milliamperes). This initiates a capacitor recharging operation. When the voltage on the storage capacitor reaches the first voltage threshold (15 volts), then the switches are turned on (closed). Capacitor recharging occurs during the "switch open time period" that the switches are off (open). See FIG. 8 for an illustration of three such switch open time periods CT1, CT2 and CT3.

The steps 201 through 206 on the left side of the flowchart represent steps that occur during initial power up of the fuse circuitry.

Figure 12:
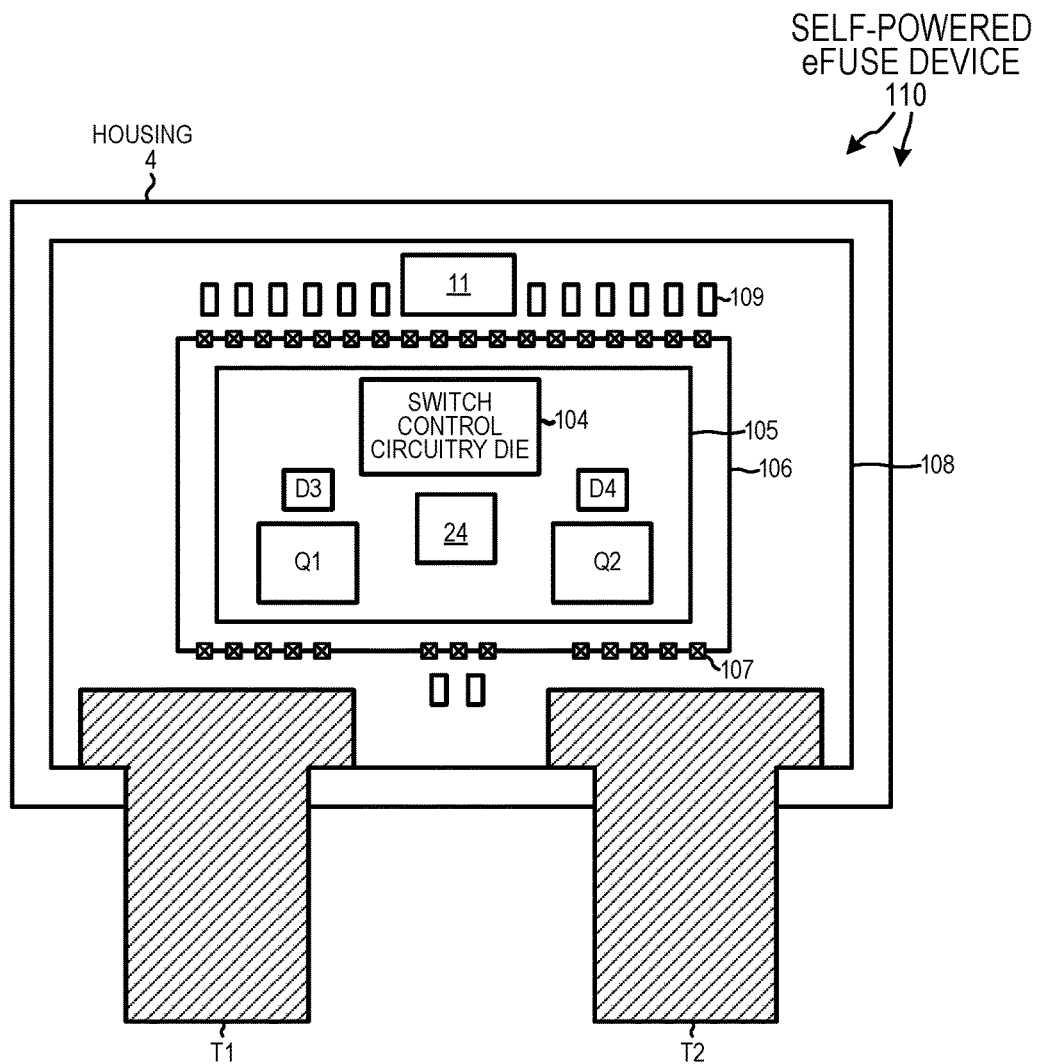
FIG. 12 is a diagram of another embodiment of a self-powered electronic fuse device.

FIG. 12 is a diagram of another embodiment 110 of a two-terminal self-powered electronic fuse device. The NFET 5, diode D1 and current mirror NFET 40 of FIG. 10 are disposed on a single die. This die is labeled as Q1 in FIG. 12. The NFET 14, diode D2, and current mirror NFET 41 of FIG. 10 are disposed on a single die. This die is labeled as Q2 in FIG. 12. These two dice may, for example, be MMIXT132N50P3 devices available from available from IXYS Corporation, 1590 Buckeye Drive, Milpitas, Calif. The depletion mode NFET 24 is third separate semiconductor die. Depletion mode NFET 24 may, for example, be an IXTA3N50D2 device available from IXYS Corporation, 1590 Buckeye Drive, Milpitas, Calif. The diode D3 of FIG. 10 is a fourth discrete semiconductor die labeled as D3 in FIG. 12. The diode D4 of FIG. 10 is a fifth discrete semiconductor die labeled as D4 in FIG. 12. These diodes may, for example, be S1JTR devices available from Sangdest Microelectronic Co., Ltd (SMC). The remainder of the circuitry of FIG. 10, but for the resistors, capacitors, pushbutton, and package terminals, is provided in integrated form on a single integrated circuit die 104. These integrated circuit dice (Q1, Q2, 24, D3, D4, 104) are surface mounted to a DCB (Direct Copper Bonded) substrate 105. The DCB 105 is the die-carrying substrate of an injection molded integrated circuit package 106. This integrated circuit package 106 has an encapsulated body portion and a number of metal package terminals. One of those metal package terminals is identified by reference numeral 107 in FIG. 12. The integrated circuit package 106 is mounted onto a Printed Circuit Board (PCB) 108. The resistors and capacitors of FIG. 10 are provided as discrete surface mount components on the PCB. One of these discrete surface mount components is identified by reference numeral 109 in FIG. 12. The large surface mount component 11 is the storage capacitor 11 of FIG. 10. The upper left five metal package terminals of the integrated circuit package 106 are coupled in parallel by conductors of the PCB to the first metal terminal T1 2. The upper right five metal package terminals of the integrated circuit package 106 are coupled in parallel by conductors of the PCB to the second metal terminal T2 3. Other conductors of the PCB (not shown) couple the surface mount resistors and capacitors to the various other terminals of the integrated circuit package 106. In one example, the first and second terminals T1 and T2 are stamped pieces of sheet metal. These stamped pieces of sheet metal are soldered or welded to the PCB. In another example, the first and second terminals T1 and T2 are metalized extensions of the PCB. The PCB 107, along with the components mounted to it, is encased within insulative housing 4. The pushbutton 34 of FIG. 10 (not shown) is surface mounted to the bottomside of the PCB 108. The pushbutton 34 is made to extend from the housing 4 so that it can be manipulated from outside the overall self-powered electronic fuse device.

Figure 13:
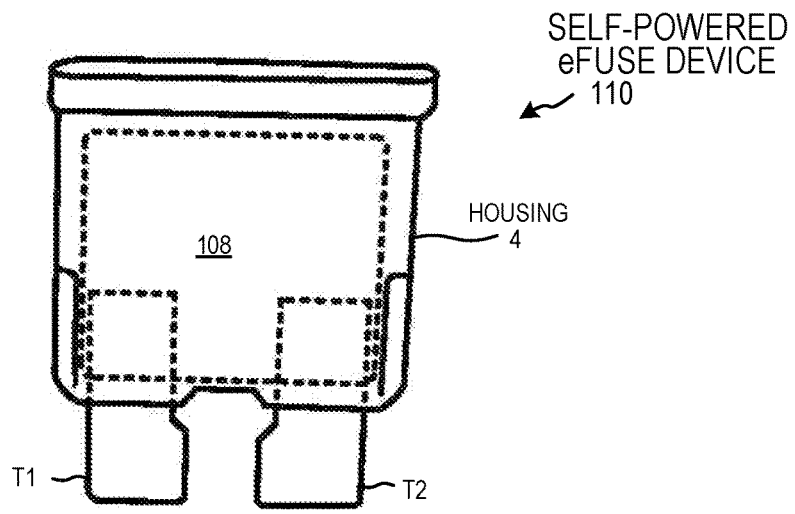
FIG. 13 is a perspective diagram of an example of the embodiment 110 of FIG. 12.

FIG. 13 is a perspective diagram of an example of the embodiment 110 of FIG. 12. In this example, the pushbutton 34 is not provided.

Although the present invention has been described in connection with certain specific embodiments for instructional purposes, the present invention is not limited thereto. Diodes D1 and D2 can be body diodes of NFETs, or can be discrete diodes that are not body diodes. Switches SW1 and SW2 can be electrically-activated mechanical switches. Although an embodiment is described that uses current mirrors to sense current AC current flow, in other examples there are no current mirrors but rather one or more current sense resistors are disposed in the main AC current path in series with the first and second switches. The source of the first NFET can be directly coupled to the source of the second NFET in a case in which current mirrors are used, or alternatively the source of the first NFET can be coupled to the source of the second NFET via a sense resistor in the event that such a sense resistor is used to sense the magnitude of AC current. In either case, the source of the first NFET is said to be coupled to the source of the second NFET. Although each of the first and second latches is a cross-coupled RS latch in the example of FIG. 10, in other embodiments it may be another kind of sequential logic element such as a flip-flop. Although a pushbutton is described above as a mechanism for resetting the self-powered electronic fuse device, other mechanisms are used in other embodiments. For example, the self-powered electronic fuse device can include a remote controlled optocoupler or an RF-controlled switch, which when made to close by remote control serves the same function as the pushbutton in resetting the self-powered electronic fuse device. Accordingly, various modifications, adaptations, and combinations of various features of the described embodiments can be practiced without departing from the scope of the invention as set forth in the claims.

What is claimed is:

1. A method involving a self-powered fuse device, the method comprising:
   (a) conducting an Alternating Current (AC) current through the self-powered fuse device, wherein the self-powered fuse device comprises a first fuse device package terminal, a second fuse device package terminal, a first switch, a second switch, and a storage capacitor, wherein the AC current flows into the self-powered fuse device via the first fuse device package terminal and flows out of the self-powered fuse device via the second fuse device package terminal;
   (b) in a first portion of a half period of the AC current, maintaining the first and second switches in an on state;
   (c) in a second portion of the half period of the AC current, maintaining the first and second switches in an off state; and
   (d) charging the storage capacitor during the second portion of the half period but not during the first portion of the half period, wherein (a) through (d) are performed by the self-powered fuse device.

2. The method of claim 1, wherein the second portion of the half period has a duration that is less than fifteen percent of the half period of the AC current.

3. The method of claim 1, further comprising:
   generating a current sense signal indicative of AC current flow through the self-powered fuse device; and
   determining when to switch the first and second switches from the on state to the off state based at least in part on the current sense signal.

4. The method of claim 3, wherein the current sense signal indicates whether the AC current flow is below a current threshold.

5. The method of claim 1, further comprising:
   (e) detecting that a voltage on the storage capacitor has reached a voltage threshold; and
   (f) in response to the detecting of (e) turning on the first and second switches, wherein the turning on of the first and second switches causes the charging of the storage capacitor to stop.

6. The method of claim 1, further comprising:
   (e) recharging the storage capacitor again such that the storage capacitor is recharged in two consecutive half periods of the AC current.

7. The method of claim 1, further comprising:
   (e) after the charging of (d) turning the first and second switches on to the on state, wherein once the first and second switches have been switched to the on state in (e) maintaining the first and second switches in the on state provided that both: 1) AC current flow through the self-powered fuse device does not exceed an overload current threshold, and 2) a voltage on the storage capacitor does not fall below a voltage threshold.

8. The method of claim 1, wherein the first fuse device package terminal and the second fuse device package terminal are the only electrical terminals of the self-powered fuse device that are accessible from outside the self-powered fuse device.

9. The method of claim 1, wherein the self-powered fuse device further comprises an amount of circuitry, wherein the self-powered fuse device comprises no battery, and wherein the charging of (d) results in energy being stored in the storage capacitor, the method comprising:
   using energy stored in the storage capacitor to power the amount of circuitry.

10. The method of claim 1, wherein the absolute magnitude of instantaneous AC current flow through the self-powered fuse during the first portion of the half period is greater at all times during the first portion than the absolute magnitude of instantaneous AC current flow through the self-powered fuse at all times during the second portion of the half period.

11. The method of claim 1, wherein the first portion is a time period of relative high AC current flow through the self-powered fuse device, and wherein the second portion is a time period of relative low AC current flow through the self-powered fuse device.

12. A method involving a self-powered fuse device, wherein the self-powered fuse device comprises a first fuse device package terminal, a second fuse device package terminal, a first switch, a second switch, a storage capacitor, and an amount of circuitry, wherein the first fuse device package terminal and the second fuse device package terminal are the only electrical terminals of the self-powered fuse device that are accessible from outside the self-powered fuse device, and wherein the self-powered fuse device comprises no battery, the method comprising:
   periodically turning off the first and second switches and recharging the storage capacitor during times when the first and second switches are both off, wherein the recharging results in energy being stored in the storage capacitor;
   using energy stored in the storage capacitor to power the amount of circuitry; and
   turning on the first and second switches and thereby allowing a current to flow into the self-powered fuse device via the first fuse device package terminal, through the first and second switches, and out of the self-powered fuse device via the second fuse device package terminal.

13. The method of claim 12, wherein the storage capacitor is not charged during any time when the first and second switches are turned on.

14. The method of claim 12, further comprising:
   turning off the first and second switches and starting recharging the storage capacitor as soon as both of the following conditions are true: 1) a current flow through the self-powered fuse device has dropped below a predetermined current, and 2) a voltage on the storage capacitor is less than a predetermined voltage.

15. The method of claim 12, further comprising:
   detecting that a current flow through the self-powered fuse device has dropped below a current threshold; and
   determining when to turn off the first and second switches and to start recharging the storage capacitor based at least in part on the detecting that the current flow has dropped below the current threshold.

16. The method of claim 14, wherein the first switch is a first transistor, wherein the second switch is a second transistor, wherein the self-powered fuse device further comprises a first current mirror that mirrors a current flow through the first transistor thereby generating a first sense current, wherein the self-powered fuse device further comprises a second current mirror that mirrors a current flow through the second transistor thereby generating a second sense current, wherein the self-powered fuse device further comprises a first sense resistor, a first comparator, a second sense resistor, a second comparator, and digital logic circuitry, wherein the method further comprises:

passing the first sense current through the first sense resistor thereby generating a first sense voltage;

supplying the first sense voltage onto a first input lead of the first comparator;

supplying a reference voltage onto a second input lead of the first comparator;

passing the second sense current through the second sense resistor thereby generating a second sense voltage;

supplying the second sense voltage onto a first input lead of the second comparator;

supplying a reference voltage onto a second input lead of the second comparator; and supplying a signal output by the first comparator onto a first input lead of the digital logic circuitry and supplying a signal output by the second comparator onto a second input lead of the digital logic circuitry such that the digital logic circuitry outputs a current sense signal.

17. The method of claim 16, wherein the current sense signal indicates whether current flow through the self-powered fuse device has dropped below the current threshold.

18. The method of claim 12, wherein the current that is allowed to flow into the self-powered fuse device due to the turning on of the first and second switches is a sinusoidal AC current, wherein the sinusoidal AC current has a half period, and wherein the storage capacitor is recharged during capacitor recharging time periods, and wherein each capacitor recharging time period has a duration that is less than fifteen percent of each half period of the sinusoidal AC current.

19. The method of claim 12, wherein the current that is allowed to flow into the self-powered fuse device due to the turning on of the first and second switches is a sinusoidal AC current, wherein the sinusoidal AC current has a half period, and wherein the first and second switches are turned off for storage capacitor recharging for less than fifteen percent of each half period of the sinusoidal AC current.

20. The method of claim 19, further comprising:

once the first and second switches have been turned on maintaining the first and second switches in the on state provided that both: 1) current flow through the self-powered fuse device does not exceed an overload current threshold, and 2) a voltage on the storage capacitor does not fall below a voltage threshold.

21. The method of claim 12, wherein the amount of circuitry comprises a sequential logic element, the self-powered fuse device further comprises a pushbutton, the method further comprising:

resetting the sequential logic element in response to the pushbutton being pressed; and setting the sequential logic element in response to detecting an overload condition.

22. The method of claim 12, wherein the amount of circuitry comprises a sequential logic element, the method further comprising:

setting the sequential logic element in response to detecting an overload condition.

23. A method involving a self-powered fuse device, wherein the self-powered fuse device comprises a first fuse device package terminal, a second fuse device package terminal, a first switch, a second switch, a storage capacitor, and an amount of circuitry, the method comprising:

periodically turning off the first and second switches and recharging the storage capacitor during times when the first and second switches are both off, wherein the recharging results in energy being stored in the storage capacitor;

using energy stored in the storage capacitor to power the amount of circuitry; and turning on the first and second switches and thereby allowing a current to flow through the self-powered fuse device in a low resistance current path, wherein the low resistance current path has a resistance of less than one hundred milliohms, and wherein the low resistance current path extends from the first fuse device package terminal, through the first and second switches, and out of the self-powered fuse device via the second fuse device package terminal.

* * * * *